United States Patent
Kang

(10) Patent No.: US 10,613,753 B2
(45) Date of Patent: Apr. 7, 2020

(54) SEMICONDUCTOR MEMORY DEVICE FOR PERFORMING SUSPEND OPERATION AND METHOD OF OPERATING THE SAME

(71) Applicant: SK hynix Inc., Gyeonggi-do (KR)

(72) Inventor: Tai Kyu Kang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 514 days.

(21) Appl. No.: 15/346,163

(22) Filed: Nov. 8, 2016

(65) Prior Publication Data

US 2018/0004421 A1 Jan. 4, 2018

(30) Foreign Application Priority Data

Jul. 4, 2016 (KR) .................. 10-2016-0084398

(51) Int. Cl.
| | |
|---|---|
| *G06F 3/00* | (2006.01) |
| *G06F 13/00* | (2006.01) |
| *G06F 3/06* | (2006.01) |
| *G06F 13/26* | (2006.01) |
| *G06F 13/24* | (2006.01) |
| *G11C 16/06* | (2006.01) |
| *G11C 14/00* | (2006.01) |

(52) U.S. Cl.
CPC ............ *G06F 3/0604* (2013.01); *G06F 3/068* (2013.01); *G06F 3/0611* (2013.01); *G06F 3/0625* (2013.01); *G06F 3/0659* (2013.01); *G06F 3/0679* (2013.01); *G06F 13/24* (2013.01); *G06F 13/26* (2013.01); *G11C 14/0009* (2013.01); *G11C 14/0054* (2013.01); *G11C 16/06* (2013.01); *Y02D 10/154* (2018.01)

(58) Field of Classification Search
None
See application file for complete search history.

(56) References Cited

U.S. PATENT DOCUMENTS

| | | | | |
|---|---|---|---|---|
| 5,302,952 A | * | 4/1994 | Campbell, Jr. | ............ G06F 3/05 341/122 |
| 5,566,338 A | * | 10/1996 | Kodama | ................. G06F 13/24 710/260 |
| 5,584,039 A | * | 12/1996 | Johnson | ................ G06F 13/126 710/1 |

(Continued)

FOREIGN PATENT DOCUMENTS

| | | |
|---|---|---|
| KR | 1020140021151 | 2/2014 |
| KR | 1020150080819 | 7/2015 |

*Primary Examiner* — Reginald G Bragdon
*Assistant Examiner* — Michael L Westbrook
(74) *Attorney, Agent, or Firm* — IP & T Group LLP

(57) ABSTRACT

Provided herein are a semiconductor memory device and a method of operating the semiconductor memory device, which have an improved processing speed for a suspend operation. The semiconductor memory device includes a memory cell array, a peripheral circuit configured to perform a data operation corresponding to an externally provided command on the memory cell array and a control circuit configured to control the peripheral circuit to perform the data operation by sequentially executing instructions corresponding to a plurality of instruction lines of an operation algorithm for the data operation and, when a suspend command is provided during the data operation, to perform a preset suspend operation in any one of a checker mode and an instant mode.

13 Claims, 10 Drawing Sheets

(56) References Cited

U.S. PATENT DOCUMENTS

| | | | | |
|---|---|---|---|---|
| 5,613,163 A | * | 3/1997 | Marron | G06F 13/126 |
| | | | | 710/1 |
| 5,805,501 A | * | 9/1998 | Shiau | G11C 16/16 |
| | | | | 365/185.29 |
| 2011/0213915 A1 | * | 9/2011 | So | G06F 3/0619 |
| | | | | 711/103 |
| 2012/0317388 A1 | * | 12/2012 | Driever | G06F 12/0646 |
| | | | | 711/170 |

* cited by examiner

SEMICONDUCTOR MEMORY DEVICE FOR PERFORMING SUSPEND OPERATION AND METHOD OF OPERATING THE SAME

CROSS-REFERENCE TO RELATED APPLICATION

The present application claims priority under 35 U.S.C. § 119(a) to Korean patent Application No. 10-2016-0084398, filed on Jul. 4, 2016, which is incorporated herein by reference in its entirety.

BACKGROUND

1. Field

Various embodiments of the present disclosure relate to electronic devices and, more particularly, to a semiconductor memory device and a method of operating the semiconductor memory device.

2. Description of Related Art

Semiconductor memory devices are memory devices realized using a semiconductor such as silicon (Si), germanium (Ge), gallium arsenide (GaAs), silicon germanium (SiGe), indium phosphide (InP), or the like. The semiconductor memory devices are chiefly categorized into volatile memory devices and nonvolatile memory devices.

A volatile memory device is a memory device in which data stored therein is lost when power is turned off. Examples of a volatile memory device include a static RAM (SRAM), a dynamic RAM (DRAM), a synchronous DRAM (SDRAM), or the like. A nonvolatile memory device is a memory device in which data stored therein is maintained even when power is turned off. Examples of a nonvolatile memory device include a read only memory (ROM), a programmable ROM (PROM), an Electrically Programmable ROM (EPROM), an Electrically Erasable and Programmable ROM (EEPROM), a Flash memory, a Phase-change RAM (PRAM), a Magnetic RAM (MRAM), a Resistive RAM (RRAM), a Ferroelectric RAM (FRAM), or the like. The Flash memories are largely categorized into NOR and NAND type.

SUMMARY

Various embodiments of the present disclosure are directed to a semiconductor memory device suitable for performing a suspend operation with improved processing speed, and a method of operating the semiconductor memory device.

One embodiment of the present disclosure provides a semiconductor memory device, including a memory cell array, a peripheral circuit configured to perform a data operation corresponding to an externally provided command on the memory cell array and a control circuit configured to control the peripheral circuit to perform the data operation by sequentially executing instructions corresponding to a plurality of instruction lines of an operation algorithm for the data operation and, when a suspend command is provided during the data operation, to perform a preset suspend operation in any one of a checker mode and an instant mode.

Another embodiment of the present disclosure provides a method of operating a semiconductor memory device including a plurality of memory cells, the method comprising performing a data operation corresponding to an externally provided command on the memory cells by sequentially executing instructions corresponding to a plurality of Instruction lines of an operation algorithm for the data operation and performing a preset suspend operation in any one of a checker mode and an Instant mode when a suspend command is provided during the data operation, wherein, in the checker mode, the preset suspend operation is performed by stopping the data operation when a suspend checker is marked in currently executed one among the plurality of instruction lines of the operation algorithm for the data operation, and wherein, in the instant mode, the preset suspend operation is performed by immediately stopping the data operation upon reception of the suspend command.

A further embodiment of the present disclosure provides a semiconductor memory device, including an execution section configured to sequentially execute instructions of an operation algorithm for a data operation corresponding to an externally provided command; and an execution control section configured to control the execution section to execute instructions for a suspend operation among the instructions of the operation algorithm for the data operation immediately upon reception of a suspend command in an instant mode, and to execute the instructions for the suspend operation when a suspend checker is marked in a currently executed one among the instructions of the operation algorithm for the data operation in a checker mode, wherein in the checker mode the execution section controls the semiconductor memory device to stop the data operation and perform the suspend operation when the suspend checker is marked in the currently executed instruction, and wherein in the instant mode the execution section controls the semiconductor memory device to immediately stop the data operation and perform the suspend operation upon reception of the suspend command.

BRIEF DESCRIPTION OF THE DRAWINGS

The above and other features and advantages of the present invention will become more apparent to those skilled in the art to which the present invention pertains by describing in detail various embodiments thereof with reference to the accompanying drawings in which.

DETAILED DESCRIPTION

Figure 1:
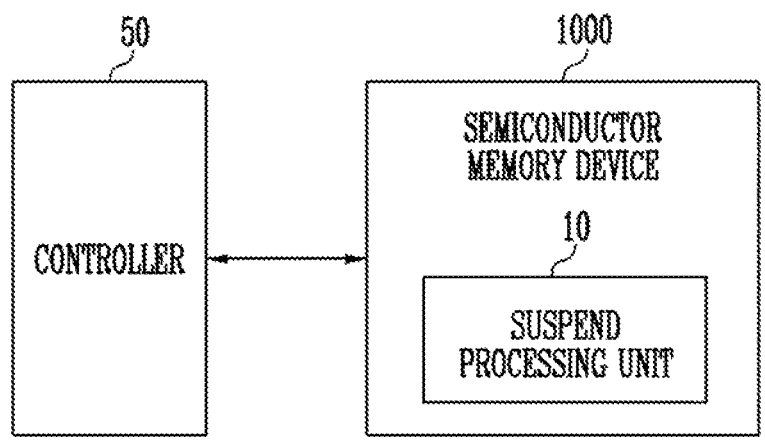
FIG. 1 is a block diagram illustrating a configuration of a memory system, according to an embodiment of the present invention.

Hereinafter, various embodiments of the present invention will be described in detail with reference to the accompanying drawings. However, the present invention may be embodied in different other forms and should not be construed as being limited to the specific embodiments set forth herein. Rather, these embodiments are provided so that this disclosure will be thorough and complete, and will fully convey the present invention to those skilled in the art to which the present invention pertains.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are simplified schematics and as such they may not illustrate all well-known features and details of the various configurations and methods. Moreover, the drawings and are not necessarily drawn to scale. In some instances, proportions may have been exaggerated in order to more clearly illustrate the various elements of the embodiments. Variations from the illustrated shapes as a result, for example, of manufacturing techniques and/or tolerances, are also to be expected. Thus, embodiments should not be construed as being limited to the particular shapes of regions illustrated herein but may include deviations in shapes that result, for example, from manufacturing techniques. In the drawings, lengths and sizes of the various elements, layers and regions may be exaggerated for clarity. Like reference numerals in the drawings denote like elements.

It will be further understood that when an element is referred to as being "on," "connected to," "coupled to" and the like in relation to another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

Spatially relative terms, such as "under," "below," "lower," "above," "upper" and the like, may be used herein for ease of description to describe one element's relationship to another element or elements as illustrated in the figures. However, it will be understood that the spatially relative terms are intended to encompass different orientations of the device in manufacturing, use or operation in addition to the orientation depicted in the figures. For example, if the device in the figures is turned over, elements described as "below" or "under" another element or elements would then be "above" the other element or elements. Hence an illustrated device may be oriented differently (rotated 90 degrees etc.) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "Includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention pertains in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

FIG. 1 is a block diagram illustrating the configuration of a memory system, according to an embodiment of the present invention.

The memory system includes a semiconductor memory device 1000 coupled to a controller 50.

The semiconductor memory device 1000 may take many alternative forms. For example the memory device may be a non-volatile memory device, such as a NAND flash memory, vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). The semiconductor memory device 1000 may be implemented as a three-dimensional array structure. The present disclosure may be applied not only to a flash memory in which a charge storage layer is implemented as a conductive floating gate (FG), but also to a charge trap flash (CTF) memory in which a charge storage layer is implemented as an insulating layer.

The semiconductor memory device 1000 may include a memory cell array. The memory cell array may include a plurality of nonvolatile memory cells.

The semiconductor memory device 1000 is configured to receive a command and an address from the controller 50 and to access an area, selected by the address, in the memory cell array. That is, the semiconductor memory device 1000 performs an internal operation corresponding to the command on the area selected by the address.

For example, the semiconductor memory device 1000 may perform at least one of a program operation, a read operation and an erase operation. In a program operation, the semiconductor memory device 1000 may program data in a memory area selected by the received address. In a read operation, the semiconductor memory device 1000 may read data from the area selected by the received address. During an erase operation, the semiconductor memory device 1000 may erase data stored in the area selected by the address.

In an embodiment, the read operation and the program operation of the semiconductor memory device 1000 may be performed on a page basis. The erase operation of the semiconductor memory device 1000 may be performed on a memory block basis.

The semiconductor memory device 1000 may, according to the embodiment of FIG. 1, include a suspend processing unit 10. A suspend command may be provided to the semiconductor memory device 1000 while the semiconductor memory device 1000 is performing an operation (e.g., one of a program operation, a read operation, an erase operation and so forth) in response to a command provided from the controller 50. Upon reception of the suspend command, if for example, the semiconductor memory device 1000 is performing a program operation, the semiconductor memory device 1000 may temporarily store the write data and suspend the program operation.

Figure 2:
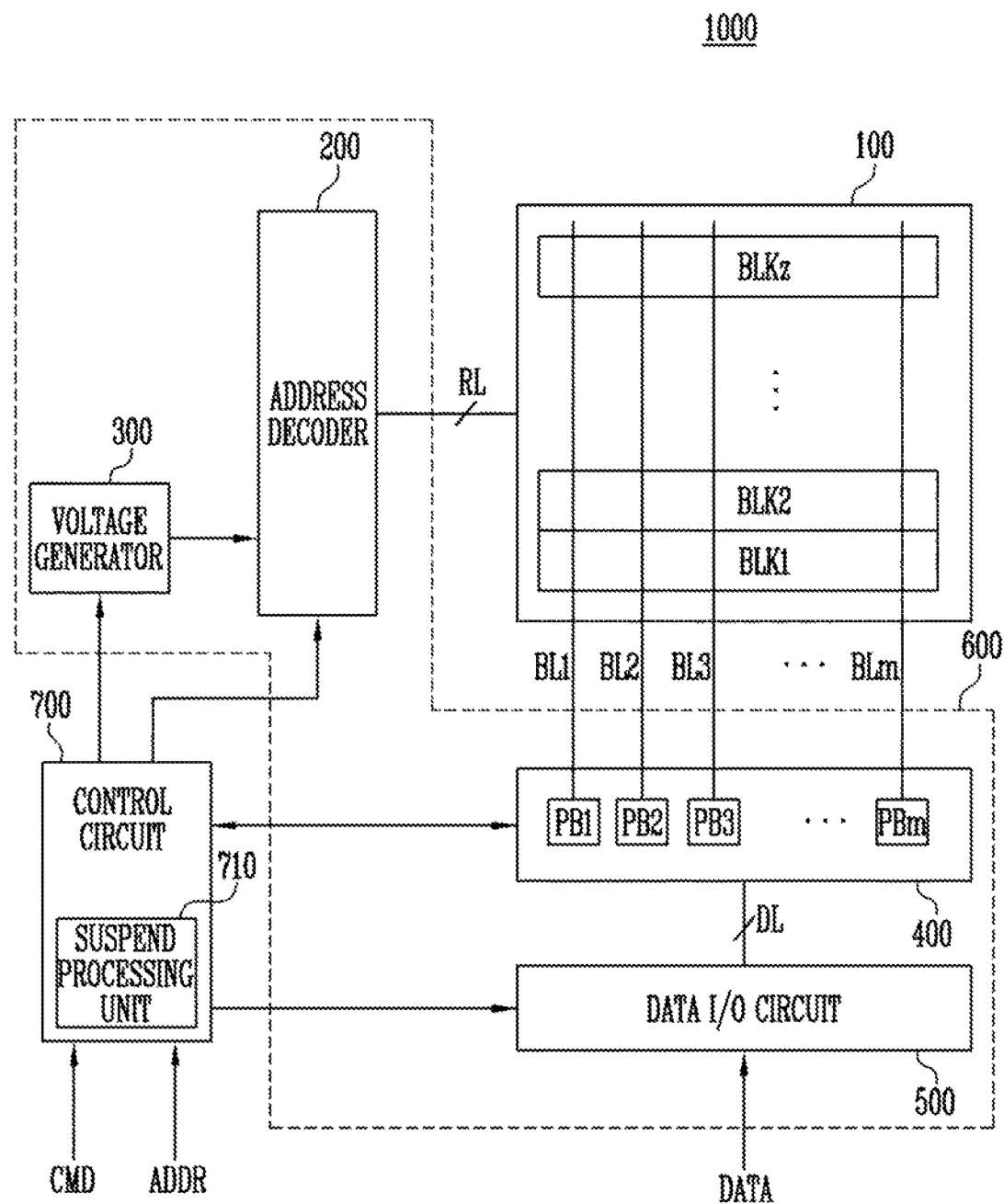
FIG. 2 is a block diagram illustrating a configuration of a semiconductor memory device, according to an embodiment of the present disclosure.

FIG. 2 is a block diagram illustrating a more detailed configuration of the semiconductor memory device 1000 of FIG. 1, according to an embodiment of the present invention.

Figure 3:
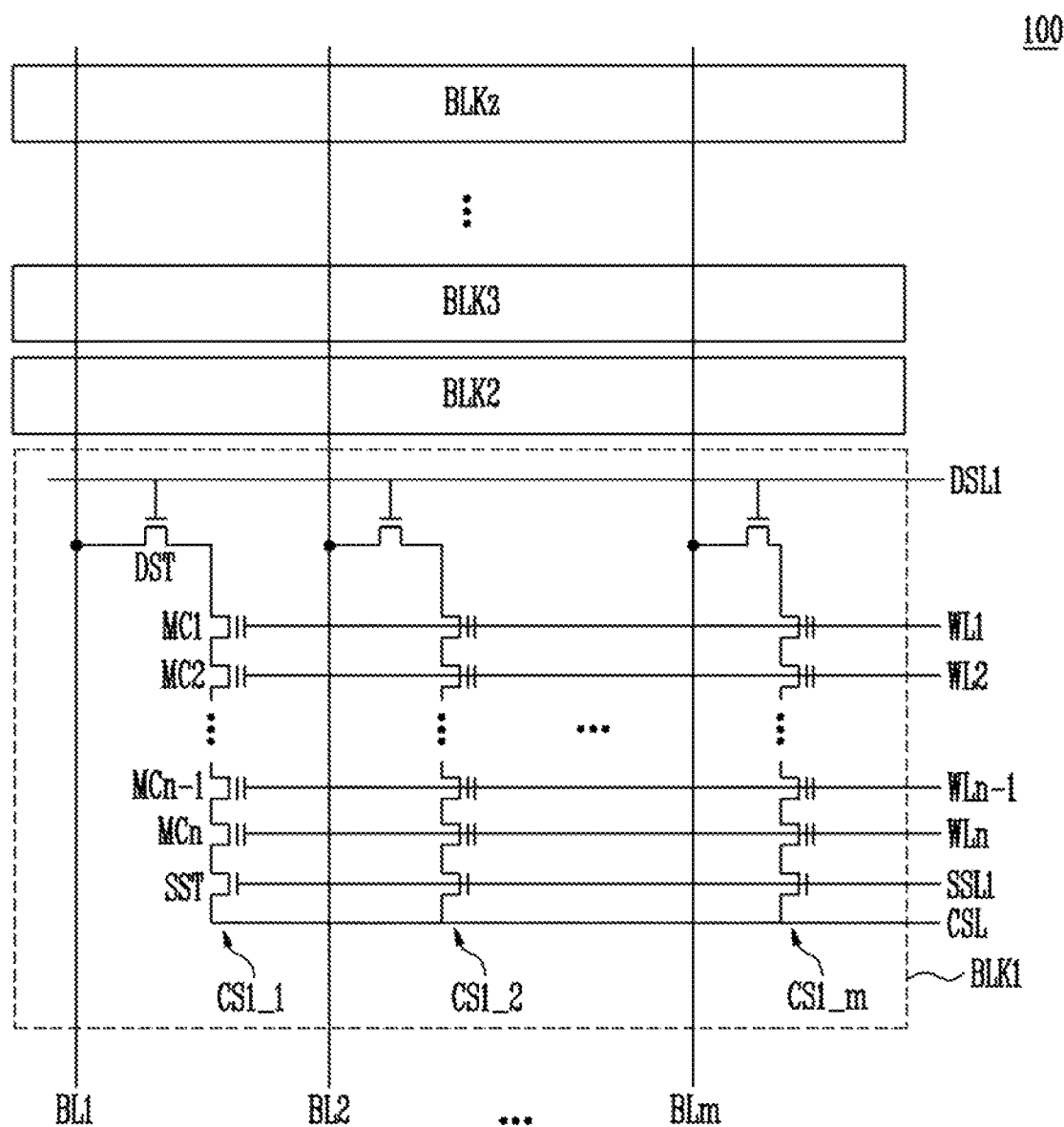
FIG. 3 is a diagram illustrating an embodiment of a memory cell array employed in the semiconductor memory device of FIG. 2.

FIG. 3 illustrates an embodiment of a memory cell array 100 of the semiconductor memory device 1000.

Referring now to FIG. 2, the semiconductor memory device 1000 includes the memory cell array 100 coupled to a peripheral circuit 600, and a control circuit (control logic) 700 coupled to the peripheral circuit 600 for controlling the operations of the semiconductor device 1000. The memory cell array 100 includes a plurality of memory blocks BLK1 to BLKz. The plurality of memory blocks BLK1 to BLKz are coupled to an address decoder 200 through row lines RLs. The plurality of memory blocks BLK1 to BLKz are coupled to a read and write circuit 400 through bit lines BL1 to BLm. Each of the memory blocks BLK1 to BLKz includes a plurality of memory cells. In an embodiment, the plurality of memory cells are nonvolatile memory cells. Memory cells coupled to the same word line are defined as a single page. That is, the memory cell array 100 includes a plurality of memory blocks BLK1 to BLKz, each block including a plurality of pages.

Referring to FIG. 3, the first to z-th memory blocks BLK1 to BLKz are coupled in common to the first to m-th bit lines BL1 to BLm. In FIG. 3, for the convenience of description, elements included in the first memory block BLK1, among the plurality of memory blocks BLK1 to BLKz, are illustrated, and the illustration of elements included in each of remaining memory blocks BLK2 to BLKz is omitted. It will be understood that each of the remaining memory blocks BLK2 to BLKz is configured in the same manner as the first memory block BLK1.

The memory block BLK1 includes a plurality of cell strings CS1_1 to CS1_m. The first to m-th cell strings CS1_1 to CS1_m are coupled to the first to m-th bit lines BL1 to BLm, respectively.

Each of the first to m-th cell strings CS1_1 to CS1_m includes a drain select transistor DST, a plurality of serially-connected memory cells MC1 to MCn, and a source select transistor SST. The gate of the drain select transistor DST is coupled to a drain select line DSL1 for controlling the operation of the transistor. The gate of the first to n-th memory cells MC1 to MCn are coupled to the first to n-th word lines WL1 to WLn, respectively for controlling the operation of the transistors. The gate of the source select transistor SST is coupled to a source select line SSL1 for controlling the operation of the source select transistor SST. The drain of the drain select transistor DST is coupled to a corresponding bit line. Hence, the drains of the drain select transistors of the first to m-th cell strings CS1_1 to CS1_m are coupled to the first to m-th bit lines BL1 to BLm, respectively. The source of the source select transistor SST is coupled to a common source line CSL. Hence, the source of each of the source select transistors is coupled to the common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are included in the row lines RLs of FIG. 2. The drain select line DSL1, the first to n-th word lines WL1 to WLn, and the source select line SSL1 are controlled by the address decoder 200. The common source line CSL is controlled by the control logic 700. The first to m-th bit lines BL1 to BLm are controlled by the read and write circuit 400.

Referring back to FIG. 2, the peripheral circuit 600 includes address decoder 200, voltage generator 300, read and write circuit 400, and data input/output (I/O) circuit 500.

The peripheral circuit 600 drives the memory cell array 100 under the control of the control circuit 700. For example, the peripheral circuit 600 may drive the memory cell array 100 so that at least one of a program operation, a read operation, and an erase operation may be performed under the control of the control circuit 700.

The address decoder 200 is coupled to the memory cell array 100 through the row lines RLs. The address decoder 200 is configured to be operated under the control of the control circuit 700. The address decoder 200 receives an address ADDR from the control circuit 700 through an I/O buffer (not shown) included in the semiconductor memory device 1000.

The address decoder 200 is configured to decode a block address in the received address ADDR. The address decoder 200 selects at least one memory block from among the memory blocks BLK1 to BLKz in response to the decoded block address. The address decoder 200 is configured to decode a row address in the received address ADDR. The address decoder 200 may select at least one word line WL of the selected memory block by applying voltages supplied from the voltage generator 300 to the at least one word line WL depending on the decoded row address.

In a program operation, the address decoder 200 may apply a program voltage to the selected word line and apply a pass voltage, having a level lower than that of the program voltage, to unselected word lines. During a program verification operation, the address decoder 200 may apply a verification voltage to the selected word line and apply a verification pass voltage, having a level higher than that of the verification voltage, to the unselected word lines.

In a read operation, the address decoder 200 may apply a read voltage to the selected word line and apply a pass voltage, having a level higher than that of the read voltage, to the unselected word lines.

In an embodiment, the erase operation of the semiconductor memory device 1000 is performed on a memory block basis. During an erase operation, the address ADDR provided to the semiconductor memory device 1000 includes a block address. The address decoder 200 may decode the block address and may select a single memory block in response to the decoded block address. During the erase operation, the address decoder 200 may apply a ground voltage to each word line coupled to the selected memory block. In an embodiment, the address decoder 200 may include a block decoder, a word line decoder, an address buffer, etc.

The voltage generator 300 is configured to generate a plurality of voltages using an external supply voltage that is supplied to the semiconductor memory device 1000. The voltage generator 300 is operated under the control of the control circuit 700.

In an embodiment, an internal supply voltage may be generated by regulating the external supply voltage. The internal supply voltage generated by the voltage generator 300 is used as an operating voltage for the semiconductor memory device 1000.

In an embodiment, the voltage generator 300 may generate a plurality of voltages using the external supply voltage or the internal supply voltage. For example, the voltage generator 300 may include a plurality of pumping capacitors that receive the internal supply voltage and may generate a plurality of voltages by selectively activating the plurality of pumping capacitors under the control of the control circuit 700. The generated voltages are applied to word lines selected by the address decoder 200.

The read and write circuit 400 includes first to m-th page buffers PB1 to PBm. The first to m-th page buffers PB1 to PBm are coupled to the memory cell array 100 through the first to m-th bit lines BL1 to BLm, respectively. The first to m-th page buffers PB1 to PBm are operated under the control of the control circuit 700.

The first to m-th page buffers PB1 to PBm transmit and receive data to and from the data I/O circuit 500. In a program operation, the first to m-th page buffers PB1 to PBm receive data DATA to be stored through the data I/O circuit 500 and the data lines DLs.

In a program operation, when a program pulse is applied to a selected word line, the first to m-th page buffers PB1 to PBm may transfer the data DATA to be stored, which is received through the data I/O circuit 500, to selected memory cells through the bit lines BL1 to BLm. The memory cells in the selected page are programmed depending on the transferred data DATA. A memory cell coupled to a bit line to which a program permission voltage (e.g. a ground voltage) is applied may have an increased threshold voltage. The threshold voltage of a memory cell coupled to a bit line to which a program prohibition voltage (e.g. a supply voltage) is applied may be maintained. During a program verification operation, the first to m-th page buffers PB1 to PBm read page data from the selected memory cells through the bit lines BL1 to BLm.

In a read operation, the read and write circuit 400 reads the data DATA from the memory cells in the selected page through the bit lines BLs, and outputs the read data DATA to the data I/O circuit 500.

During an erase operation, the read and write circuit 400 may float the bit lines BLs. In an embodiment, the read and write circuit 400 may include a column select circuit.

The data I/O circuit 500 is coupled to the first to m-th page buffers PB1 to PBm through the data lines DLs. The data I/O circuit 500 is operated under the control of the control circuit 700. In a program operation, the data I/O circuit 500 receives the data DATA to be stored from an external controller (not shown). In a read operation, the data I/O circuit 500 outputs data transferred from the first to m-th page buffers PB1 to PBm, included in the read and write circuit 400, to the external controller.

The control circuit 700 is coupled to the address decoder 200, the voltage generator 300, the read and write circuit 400, and the data I/O circuit 500. The control circuit 700 may control the overall operation of the semiconductor memory device 1000. The control circuit 700 receives a command CMD and an address ADDR from the external controller. The control circuit 700 may control the peripheral circuit 600 in response to the command CMD. The control circuit 700 may control the address decoder 200, the voltage generator 300, the read and write circuit 400, and the data I/O circuit 500 so that an operation corresponding to the received command is performed. In an embodiment, the control circuit 700 may apply a high erase voltage Verase to a source line during an erase operation.

More specifically, in response to an externally provided command, the control circuit 700 may control the peripheral circuit 600 to perform an operation corresponding to the provided command. In an embodiment, the provided command may be any one of a program command, a read command, and an erase command. Operation algorithms corresponding to respective commands may be stored in advance in a Read Only Memory (ROM) (not shown) included in the control circuit 700. Each of the operation algorithms may include a plurality of instruction lines, each of which may include instructions required to control the peripheral circuit 600 to perform the operation corresponding to the provided command. The operation algorithm may be executed according to the output of an operation counter. The operation counter may increase an instruction line address (Instruction line address#) in response to a provided clock. The instructions of the plurality of instruction lines in the operation algorithm may be executed according to the instruction line address indicated by the output of the operation counter. In an embodiment, regular part or random part of the plurality of instruction lines may be marked with suspend checkers in the respective operation algorithms.

The control circuit 700 may further include the suspend processing unit 710. Upon receipt of a suspend command, the suspend processing unit 710 may control the peripheral circuit 600 so that the semiconductor memory device 1000 suspends i.e., stops a currently ongoing operation (e.g., one of a program operation, a read operation, an erase operation and so forth) and performs a preset suspend operation in response to the received suspend command.

In an embodiment, the suspend processing unit 710 may initiate a suspend operation mode upon receipt of a suspend command. The suspend operation mode may include a checker mode and an instant mode.

In the checker mode, the semiconductor memory device 1000 does not stop an ongoing operation upon reception of a suspend command. In the checker mode, the suspend command is processed at turns of the instructions represented by some instruction lines marked with suspend checkers while the instructions of the operation algorithm for the ongoing operation are sequentially executed.

In the instant mode, the semiconductor memory device 1000 stops an ongoing operation and performs the preset suspend operation in response to the suspend command upon reception of the suspend command regardless of the suspend checkers.

The suspend processing unit 710 corresponds to the suspend processing unit 10 of FIG. 1.

The operation of the suspend processing unit 710 will be described in greater detail later with reference to FIG. 7.

Figure 4:
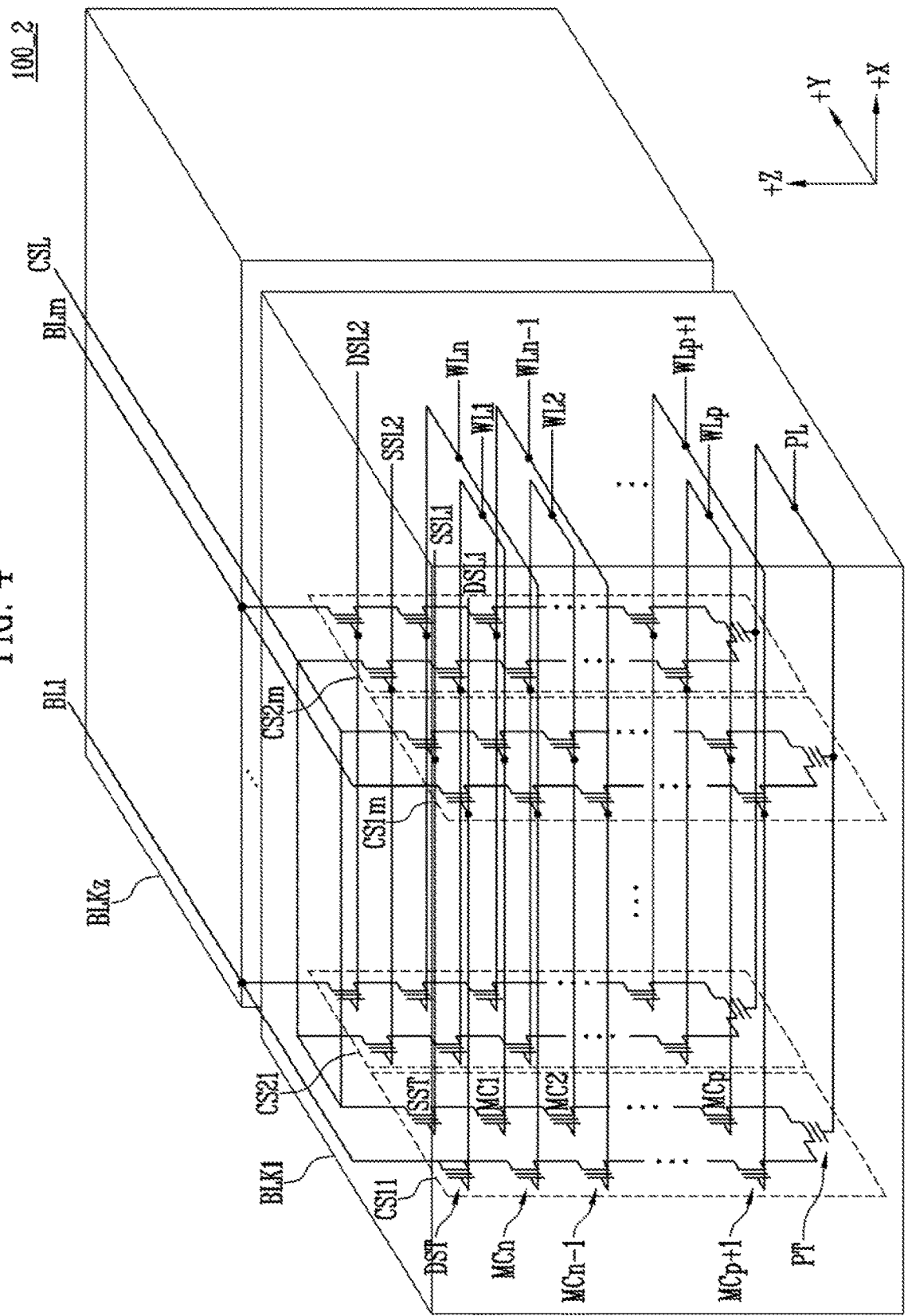
FIG. 4 is a diagram illustrating another embodiment of the memory cell array of the semiconductor memory device of FIG. 2.

FIG. 4 illustrates another embodiment of the memory cell array of FIG. 2.

Referring to FIG. 4, a memory cell array 100_2 includes a plurality of memory blocks BLK1 to BLKz. In FIG. 4, for the convenience of description, the internal configuration of the first memory block BLK1 is illustrated, and the Illustration of the internal configuration of the remaining memory blocks BLK2 to BLKz is omitted. It will be understood that the second to z-th memory blocks BLK2 to BLKz have the same configuration as the first memory block BLK1.

Referring to FIG. 4, the first memory block BLK1 includes a plurality of cell strings CS11 to CS1m and CS21 to CS2m. In the illustrated embodiment of FIG. 4, each of the cell strings CS11 to CS1m and CS21 to CS2m is formed in a 'U' shape. In the first memory block BLK1, m cell strings are arranged in a row direction (i.e. +X direction) and two cell strings are arranged in a column direction (i.e. +Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between a common source line CSL and memory cells MC1 to MCp.

In an embodiment, the source select transistors of cell strings arranged in the same row are coupled to a source select line extended in a row direction, and source select transistors of cell strings arranged in different rows are coupled to different source select lines. In FIG. 4, the source select transistors of cell strings CS11 to CS1m in a first row are coupled to a first source select line SSL1. The source select transistors of cell strings CS21 to CS2m in a second row are coupled to a second source select line SSL2.

In another embodiment, the source select transistors of the cell strings CS11 to CS1m and CS21 to CS2m may be coupled in common to a single source select line.

The first to n-th memory cells MC1 to MCn in each cell string are connected between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a +Z direction, and are connected In series between the source select transistor SST and the pipe transistor PT. The p+i-th to n-th memory cells MCp+1 to MCn are sequentially arranged in the +Z direction, and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

In an embodiment, at least one of the first to n-th memory cells MC1 to MCn may be used as a dummy memory cell. When a dummy memory cell is provided, the voltage or current of the corresponding cell string may be more stably controlled. Accordingly, the reliability of data stored in the memory block BLK1 is improved.

The gate of the pipe transistor PT of each cell string is coupled to a pipeline PL.

The drain select transistor DST of each cell string is connected between the corresponding bit line and the memory cells MCp+1 to MCn. The cell strings arranged in a row direction are coupled to drain select lines extended in a row direction. The drain select transistors of cell strings CS11 to CS1m in the first row are coupled to a first drain select line DSL1. The drain select transistors of cell strings CS21 to CS2m in the second row are coupled to a second drain select line DSL2.

Cell strings arranged in a column direction are coupled to bit lines extended in a column direction. In FIG. 4, cell strings CS11 and CS21 in a first column are coupled to a first bit line BL1. Cell strings CS1m and CS2m in an m-th column are coupled to an m-th bit line BLm.

The memory cells coupled to the same word line in cell strings arranged in a row direction constitute a single page. For example, memory cells coupled to the first word line WL1, among cell strings CS11 to CS1m in the first row, constitute a single page. Memory cells coupled to the first word line WL1, among the cell strings CS21 to CS2m in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

Figure 5:
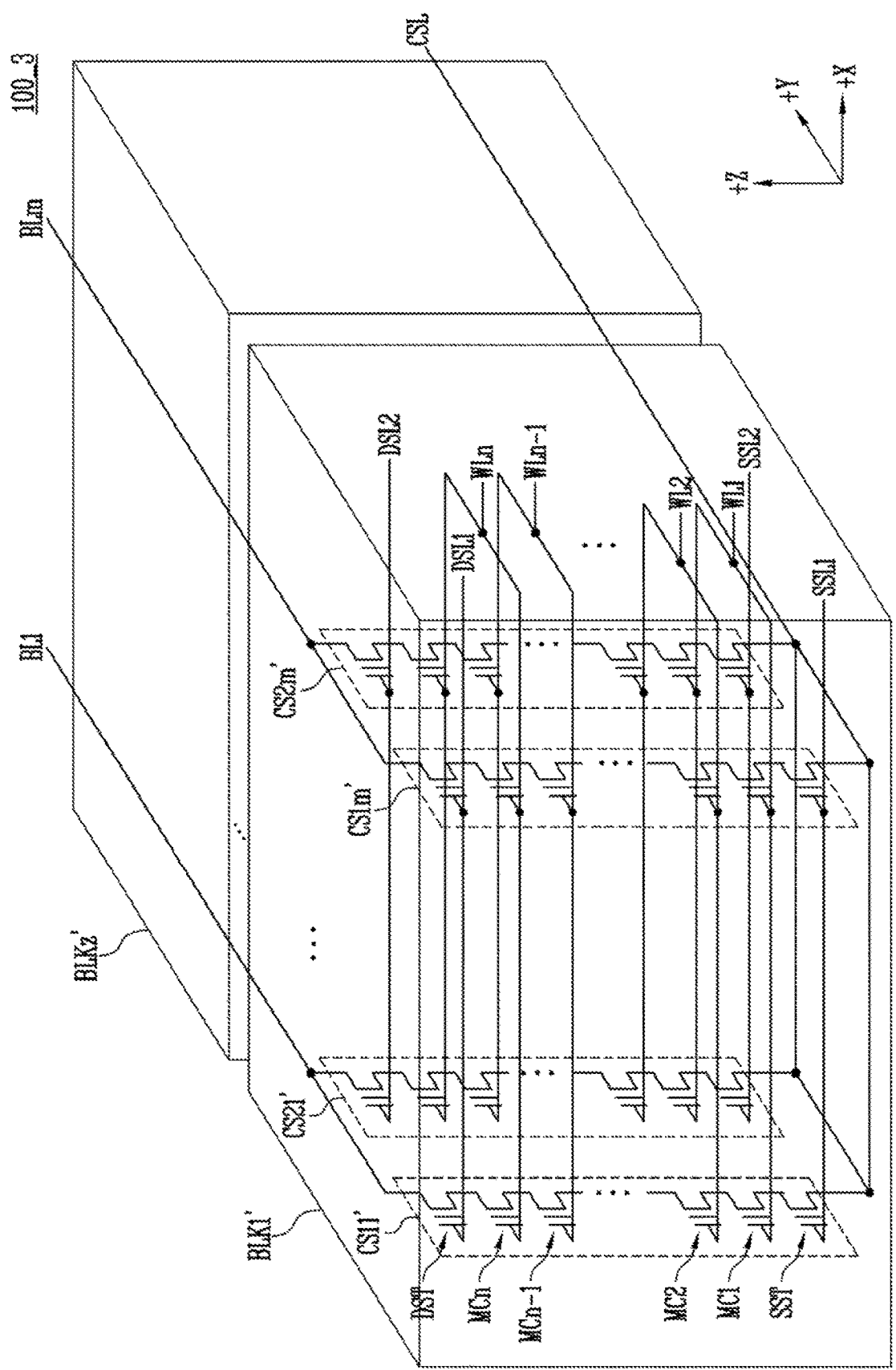
FIG. 5 is a diagram illustrating yet another embodiment of the memory cell array of the semiconductor memory device of FIG. 2.

FIG. 5 illustrates another embodiment of the memory cell array of FIG. 2.

Referring to FIG. 5, a memory cell array 100_3 includes a plurality of memory blocks BLK1' to BLKz. In FIG. 5, for the convenience of description, the internal configuration of the first memory block BLK1' is illustrated, and the illustration of the internal configuration of the remaining memory blocks BLK2' to BLKz' is omitted. It will be understood that the second to z-th memory blocks BLK2' to BLKz' are configured in the same manner as the first memory block BLK1'.

The first memory block BLK1' includes a plurality of cell strings CS11' to CS1m' and CS21' to CS2m'. Each of the plurality of cell strings CS11' to CS1m' and CS21' to CS2m' is extended along a +Z direction. In the first memory block BLK1', m cell strings are arranged in a +X direction. In FIG. 5, two cell strings are shown as being arranged in a +Y direction. However, this configuration is made for the convenience of description, and it will be understood that three or more cell strings may be arranged in a column direction.

Each of the cell strings CS11' to CS1m' and CS21' to CS2m' includes at least one source select transistor SST, first to n-th memory cells MC1 to MCn, and at least one drain select transistor DST.

The source select transistor SST of each cell string is connected between a common source line CSL and the memory cells MC1 to MCn. The gate of each source select transistor of the cell strings arranged in the same row are coupled to the same source select line. The gates of the source select transistors of cell strings CS11' to CS1m' arranged in a first row are coupled to a first source select line SSL1. The gates of the source select transistors of cell strings CS21' to CS2m' arranged in a second row are coupled to a second source select line SSL2. In another embodiment, the gates of the source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding cell string may be stably controlled. Accordingly, the reliability of data stored in the memory block BLK1' is improved.

The drain select transistor DST of each cell string is connected between the corresponding bit line and the memory cells MC1 to MCn. The gates of the drain select transistor of the cell strings arranged in a row direction are coupled to drain select lines extended in a row direction. For example, the gates of the drain select transistors of the cell strings CS11' to CS1m' in the first row are coupled to a first drain select line DSL1. The gates of the drain select transistors of the cell strings CS21' to CS2m' in the second row are coupled to a second drain select line DSL2.

As a result, the memory block BLK1' of FIG. 5 has an equivalent circuit similar to that of the memory block BLK1 of FIG. 4 except that a pipe transistor PT is excluded from each cell string in FIG. 5.

Figure 6:
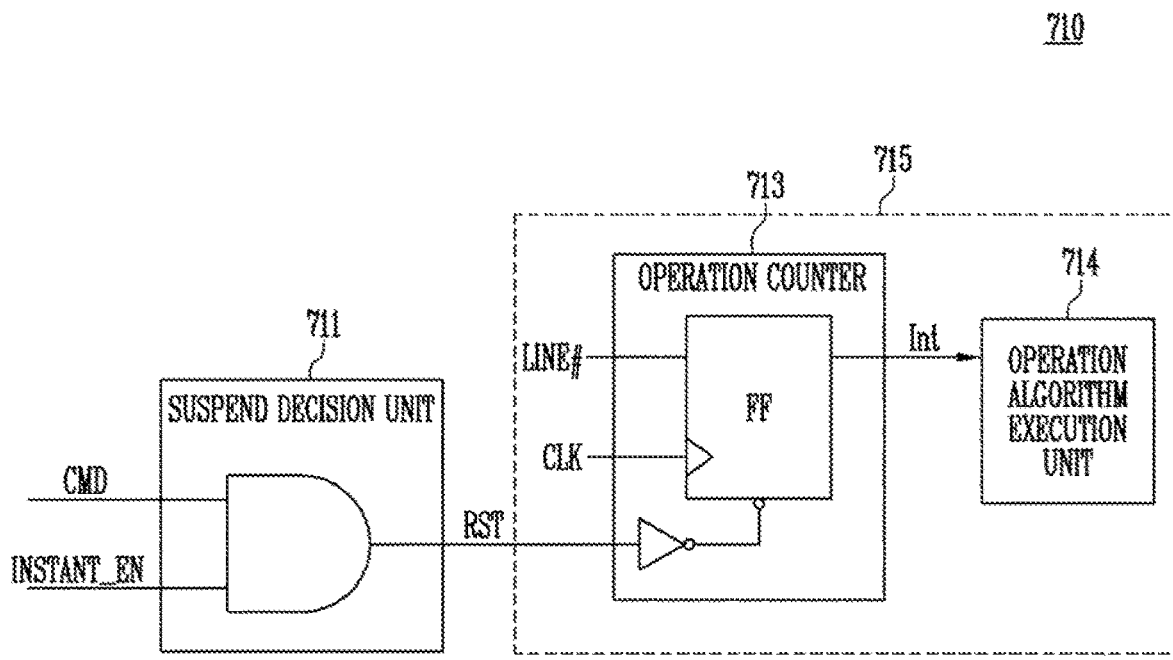
FIG. 6 is a block diagram illustrating a configuration of a suspend processing unit employed in the semiconductor memory device of FIG. 2, according to an embodiment of the present disclosure.

FIG. 6 illustrates a configuration of the suspend processing unit 710 of FIG. 2.

Referring to FIG. 6, the suspend processing unit 710 includes a suspend decision unit 711 and an operation processing unit 715.

The suspend decision unit 711 may output a reset signal RST to the operation processing unit 715 according to a suspend operation mode (i.e., any one of the checker mode and the instant mode) when the suspend command is provided. In an embodiment, the suspend decision unit 711 may process the suspend command in the suspend operation mode.

The suspend decision unit 711 may receive the suspend command CMD from the outside of the semiconductor memory device 1000, and an instant mode enable signal EN generated from the inside of the semiconductor memory device 1000.

While the instant mode enable signal EN has a first logic level (e.g., a low level or "0"), the suspend decision unit 711 may operate in the checker mode. While the instant mode enable signal EN has a second logic level (e.g., a high level or "1"), the suspend decision unit 711 may operate in the instant mode.

In the checker mode, the operation algorithm execution unit 714 sequentially executes the instructions of the operation algorithm for the currently ongoing operation while the suspend decision unit 711 does not immediately output the reset signal RST upon reception of the suspend command. Instead, the suspend decision unit 711 outputs the reset signal RST at turns of the instructions represented by some instruction lines marked with suspend checkers while the instructions of the operation algorithm for the currently ongoing operation are sequentially executed. As described above, a regular part or a random part of the plurality of instruction lines may be marked with the suspend checkers in the respective operation algorithms.

In the instant mode, the suspend decision unit 711 may instantly output the reset signal RST to the operation processing unit 715 upon reception of the suspend command CMD. In an embodiment, the suspend decision unit 711 may include an AND gate for outputting the reset signal RST based on the suspend command CMD and the instant mode enable signal EN.

The operation processing unit 715 may include an operation counter 713 and an operation algorithm execution unit 714.

When a command is provided from the outside of the semiconductor memory device 1000, the operation processing unit 715 may execute an operation algorithm corresponding to the provided command. In an embodiment, the provided command may be any one of a program command, a read command, and an erase command. The operation algorithm corresponding to each command may be executed by the operation algorithm execution unit 714. As described above, the operation algorithm is composed of a plurality of instruction lines, each of which includes instructions required to perform an operation corresponding to the provided command.

The operation algorithm may be executed according to the output of the operation counter 713. The operation counter 713 may increase an instruction line address ADD in response to a provided clock CLK. The operation algorithm execution unit 714 may execute the instructions corresponding to the instruction line LINE# indicated by the instruction line address ADD output from the operation counter 713.

In an embodiment, when the reset signal RST is provided from the suspend decision unit 711, the operation counter 713 may output an initialization signal INT to the operation algorithm execution unit 714. In response to the initialization signal INT, the operation algorithm execution unit 714 may execute the instructions corresponding to the initial instruction line of the operation algorithm for the currently ongoing operation. It is exemplified that the initial instruction line of the operation algorithm includes instructions for a suspend operation to be performed in response to the suspend command. In an embodiment, the operation counter 713 may be configured using a flip-flop (FF).

The operation algorithm execution unit 714 may include a ROM (not shown) for storing the operation algorithms for the operations to be performed in response to the externally provided command (e.g., a program command, a read command and an erase command).

In an embodiment, the operation algorithm execution unit 714 may execute the Instructions corresponding to the initial instruction line of the operation algorithm for the currently ongoing operation when the initialization signal INT representing the initial instruction line is provided from the operation counter 713 in response to the suspend command. As exemplified above, the initial instruction line of the operation algorithm may include instructions for the suspend operation to be performed in response to the suspend command. Therefore, the operation algorithm execution unit 714 may perform the suspend operation according to the initialization signal INT provided from the initialized operation counter 713.

Figure 7:
FIG. 7 is a diagram illustrating an example of an operation algorithm or performing an operation, according to an embodiment of the present disclosure.

FIG. 7 is a diagram illustrating an example of an operation algorithm.

Referring to FIG. 7, the operation algorithm may include the plurality of instruction lines LINE#7001 and descriptions 7003 each description 7003 corresponding to a respective instruction lines LINE#7001. The plurality of instruction lines LINE# may be indicated by respectively corresponding instruction line addresses ADD in the operation algorithm. The descriptions include instructions required to perform a specific operation. As the instructions are executed, the semiconductor memory device 1000 performs the corresponding operation by controlling the peripheral circuit 600.

FIG. 7 exemplifies A 0-th instruction line (line 0) of the initial instruction line including the instruction required to perform the suspend operation when the suspend command is provided.

For example, the operation algorithm may be executed as the instructions corresponding to the instruction lines in the operation algorithm are sequentially changed according to the sequentially increasing instruction line address ADD provided from the operation counter 713.

In an embodiment, the operation algorithm may include the suspend checkers regularly or randomly marked in the plurality of instruction lines of the operation algorithm. FIG. 7 exemplifies an operation algorithm including the suspend checkers are marked in a second instruction line (Line 2), a fifth instruction line (Line 5), and a seventh instruction line (Line 7), respectively.

In the checker mode, when a suspend command is received form the external device while the instructions of a third instruction line (Line 3) are currently being executed, the semiconductor memory device 1000 executes sequentially the instructions of the operation algorithm without immediately processing the suspend command. At the turn of the fifth instruction line (Line 5), with which the suspend checker is marked, the semiconductor memory device 1000 checks whether the suspend command has been provided, and then processes the provided suspend command according to the suspend checker of the fifth instruction line (Line 5). The processing of the suspend command may be executed by the suspend decision unit 711 and the operation counter 713, which are described above with reference to FIG. 6. That is, at the turn of the fifth instruction line (Line 5) of the operation algorithm, the suspend decision unit 711 outputs the reset signal RST to the operation counter 713, the operation counter 713 outputs the initialization signal INT to the operation algorithm execution unit 714, and the operation algorithm execution unit 714 may perform the suspend operation of the initial instruction line (i.e., Line 0).

In an embodiment, the suspend operation may be an operation of storing temporarily data that is currently being programmed or of storing internal parameter values of the semiconductor memory device 1000 when the suspend command is provided. Details of the suspend operation are not limited by the description of FIG. 6.

In the instant mode, the semiconductor memory device 1000 immediately processes the suspend command of the initial instruction line of the operation algorithm for the currently ongoing operation regardless of the suspend checkers when the suspend command is provided. In an embodiment, in the instant mode, upon receipt of a suspend command the semiconductor device may immediately stop the execution of an ongoing operation to perform a suspend operation. Upon completion of the suspend operation the semiconductor may resume the execution of the ongoing operation which was interrupted by the suspend command.

Figure 8:
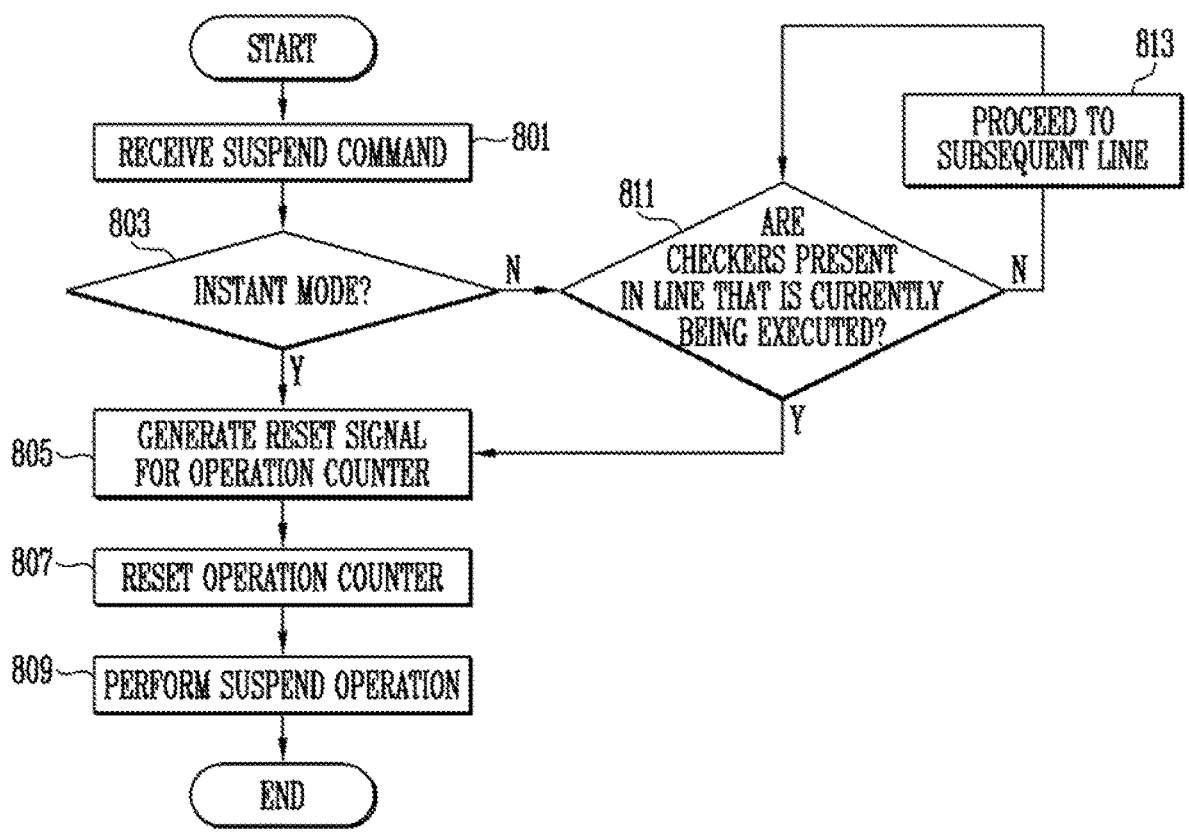
FIG. 8 is a flowchart illustrating an operation of the semiconductor memory device, according to an embodiment of the present disclosure.

FIG. 8 is a flowchart explaining the operation of the semiconductor memory device 1000, according to an embodiment of the present invention.

Referring to FIG. 8, the semiconductor memory device 1000 receives the suspend command at step 801.

At step 803, the suspend decision unit 711 of the semiconductor memory device 1000 may determine whether the processing mode of the suspend command is the instant mode. For example, the suspend decision unit 711 of the semiconductor memory device 1000 may determine whether the internal instant mode enable signal INSTANT_EN is "1" or "0". If it is determined at step 803 that the processing mode is the instant mode, the process proceeds to step 805, whereas if it is determined at step S803 that the processing mode is the checker mode, the process proceeds to step 811.

At step 805, in the instant mode, the suspend decision unit 711 of the semiconductor memory device 1000 may generate and output the reset signal RST to the operation counter 713.

At step 807, the operation counter 713 may be reset In response to the reset signal RST. When the operation counter 713 is reset, the operation counter 713 may output the initialization signal INT to the operation algorithm execution unit 714. The Initialization signal INT indicates the suspend operation of the initial instruction line of the operation algorithm for the currently ongoing operation.

At step 809, in response to the initialization signal INT, the operation algorithm execution unit 714 of the semiconductor memory device 1000 performs the suspend operation by executing the instructions of the initial instruction line of the operation algorithm for the currently ongoing operation. In an embodiment, the suspend operation may be an operation of storing temporarily data that is being programmed when the suspend command is provided. In another embodiment, the suspend operation may include storing internal parameter values of the semiconductor memory device when the suspend command is provided. The temporary storing may last only for so long as it may be needed for the interrupted ongoing operation to be resumed. Suspending an ongoing operation may be needed in order to allow the execution of another operation. For example, in a flash memory program and erase operations take generally longer time to be completed than read operations and an external system employing the flash memory may need to access the flash memory device to read data before a program operation or an erase operation is competed. In such a case, the host may issue a suspend command to temporarily suspend the ongoing program or erase operation to allow performing a read command for getting data from the flash memory device. Once the read command is completed, the interrupted ongoing operation may be resumed.

At step 811 in the checker mode, the operation algorithm execution unit 714 of the semiconductor memory device 1000 may determine whether the suspend checker is marked in the instruction line that is being executed when the suspend command for a checker mode operation is received while executing the operation algorithm. As described above, some of the plurality of instruction lines may be marked with suspend checkers in each of the respective operation algorithms. The marking with the suspend checkers may be on regular intervals e.g., every two, three or more instruction lines a suspend marker may be added. The marking with the suspend markers may be on a random pattern. When the currently executed instruction line is not marked with the suspend checker, the process proceeds to step 813.

At step 813, the operation counter 713 of the semiconductor memory device 1000 increases the instruction line address ADD, and the operation algorithm execution unit 714 proceeds to a subsequent instruction line according to the increased instruction line address ADD, and executes the instructions of the subsequent instruction line, and then the process is returned to step 811.

Steps 811 and 813 may be repeated until an instruction line is executed which is marked with the suspend checker. When the currently executed instruction line is marked with the suspend checker (see Yes at step 811) the process proceeds to steps 805 to 809 as described above for performing the suspend operation. When the process moves to the step 805 the ongoing operation is temporarily suspended.

Figure 9:
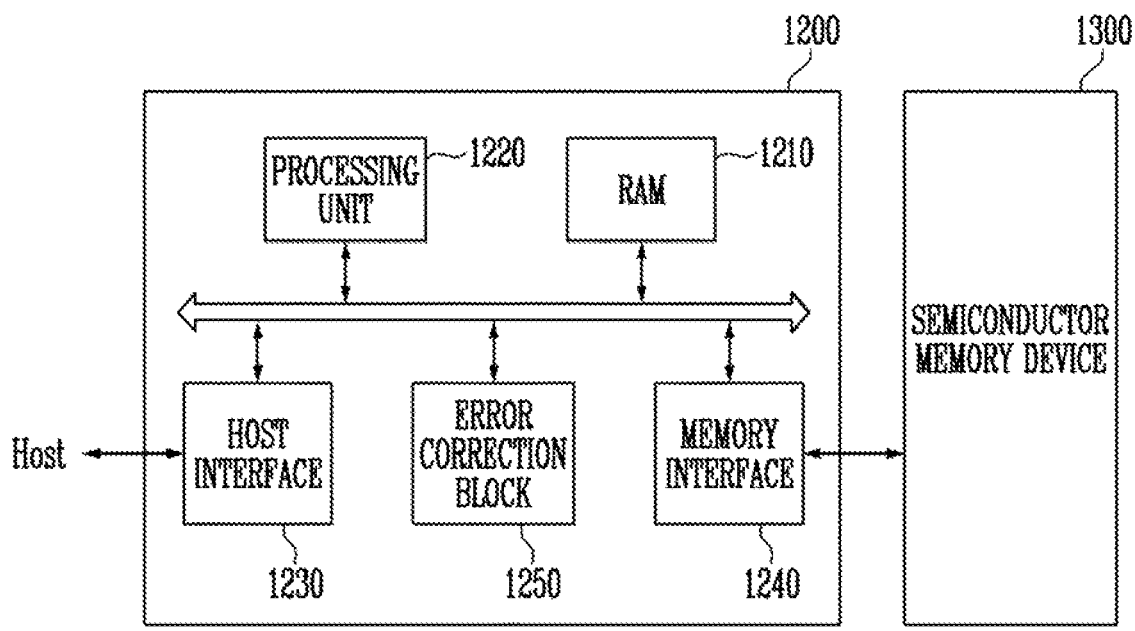
FIG. 9 is a block diagram illustrating a memory system coupled to a host, according to an embodiment of the present disclosure.

FIG. 9 illustrates a memory system coupled to a host according to an embodiment of the present invention. The memory system includes a controller 1200 coupled to a semiconductor memory device 1300. The host is operatively coupled to the memory system via the controller 1200. The memory system of FIG. 9 may be identical to the memory system of FIG. 1. More specifically, FIG. 9, exemplifies a configuration example of the controller of the memory system, according to an embodiment of the present invention.

Referring to FIG. 9, a controller 1200 includes a random access memory (RAM) 1210, a processing unit 1220, a host interface 1230, a memory interface 1240, and an error correction block 1250, all coupled via an internal bus.

The processing unit 1220 controls the overall operation of the controller 1200. The RAM 1210 may be used as at least one of an operation memory of the processing unit 1220, a cache memory between a semiconductor memory device 1300 and the host, and a buffer memory between the semiconductor memory device and the host.

The host interface 1230 includes a protocol for performing data exchange between the host and the controller 1200. In an embodiment, the controller 1200 may be configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1240 interfaces with the semiconductor memory device. Any suitable memory interface may be used depending upon the type of the semiconductor device 1300. For example, when the semiconductor device is a NAND flash memory the memory interface may be a NAND memory interface.

The error correction block 1250 may decode, using an error correction code, data received from the semiconductor memory device. Any suitable error correction block may be employed.

The semiconductor memory device 1300 of FIG. 9 may be configured and operated in the same manner as the semiconductor memory device 1000 of FIG. 2.

Figure 10:
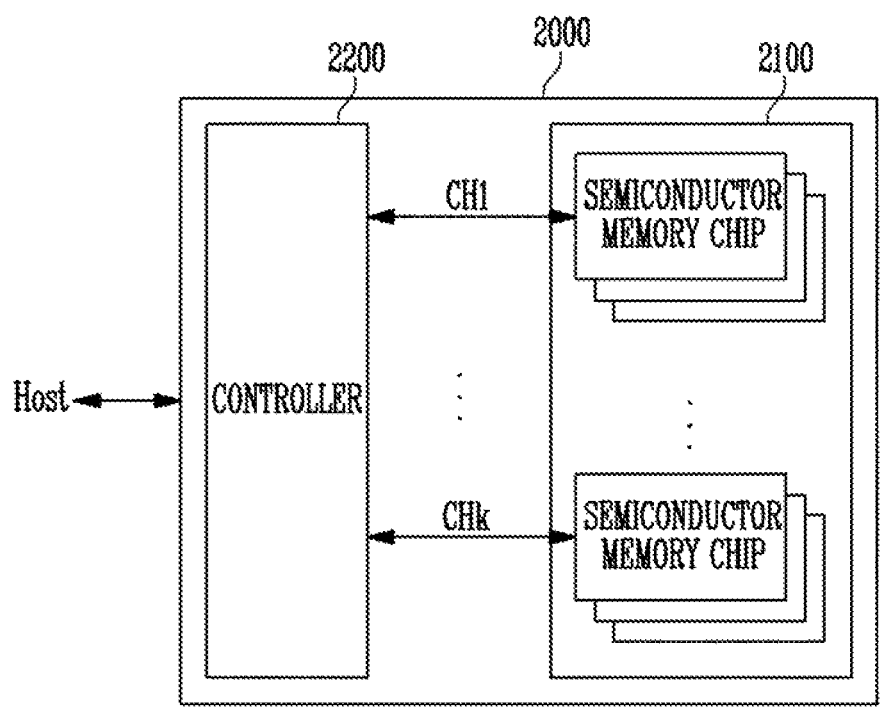
FIG. 10 is a block diagram illustrating a memory system coupled to a host, according to another embodiment of the present disclosure.

FIG. 10 illustrates another example of a memory system 2000 coupled to a host, according to an embodiment of the present invention.

Referring to FIG. 10, the memory system 2000 includes a semiconductor memory device 2100 and a controller 2200. The semiconductor memory device 2100 includes a plurality of memory chips. The semiconductor memory chips are divided into a plurality of groups.

In FIG. 10, it is illustrated that the plurality of groups respectively communicate with the controller 2200 through first to k-th channels CH1 to CHk. Each semiconductor memory chip may be configured and operated in the same manner as the semiconductor memory device 1000 described with reference to FIG. 2.

Each group is configured to communicate with the controller 2200 through a single common channel. The controller 2200 may have the same configuration as the controller 1200 described with reference to FIG. 9 and be configured to control the plurality of memory chips of the semiconductor memory device 2100 through the plurality of channels CH1 to CHk. In FIG. 10, a plurality of semiconductor memory chips are illustrated as being coupled to each channel. However, it will be understood that the memory system 2000 may be modified such that a single memory chip is coupled to each channel.

The controller 2200 and the semiconductor memory device 2100 may be integrated into a single semiconductor device. In an embodiment, the controller 2200 and the semiconductor memory device 2100 may be integrated into a single semiconductor device to form a memory card. For example, the controller 2200 and the semiconductor memory device 2100 may be integrated into a single semiconductor device to form a memory card such as a personal computer memory card international association (PCM-CIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), or the like.

The controller 2200 and the semiconductor memory device 2100 may be integrated into a single semiconductor device to form a solid state drive (SSD). When the memory system is used as the SSD, an operation speed of the host Host coupled to the memory system 2000 may be improved substantially.

In another embodiment, the memory system 2000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an exemplary embodiment, the semiconductor memory device 2100 or the memory system 2000 may be embedded in various packages. For example, the semiconductor memory device 2100 or the memory system 2000 may be packaged as a Package on Package (PoP), Ball grid arrays (BGAs), Chip scale packages (CSPs), Plastic Leaded Chip Carrier (PLCC), a Plastic Dual In Line Package (PDIP), a Die in Waffle Pack, a Die in Wafer Form, a Chip On Board (COB), a Ceramic Dual In Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi-Chip Package (MCP), a Wafer-level Fabricated Package (WFP), a Wafer-Level Processed Stack Package (WSP), or the like.

Figure 11:
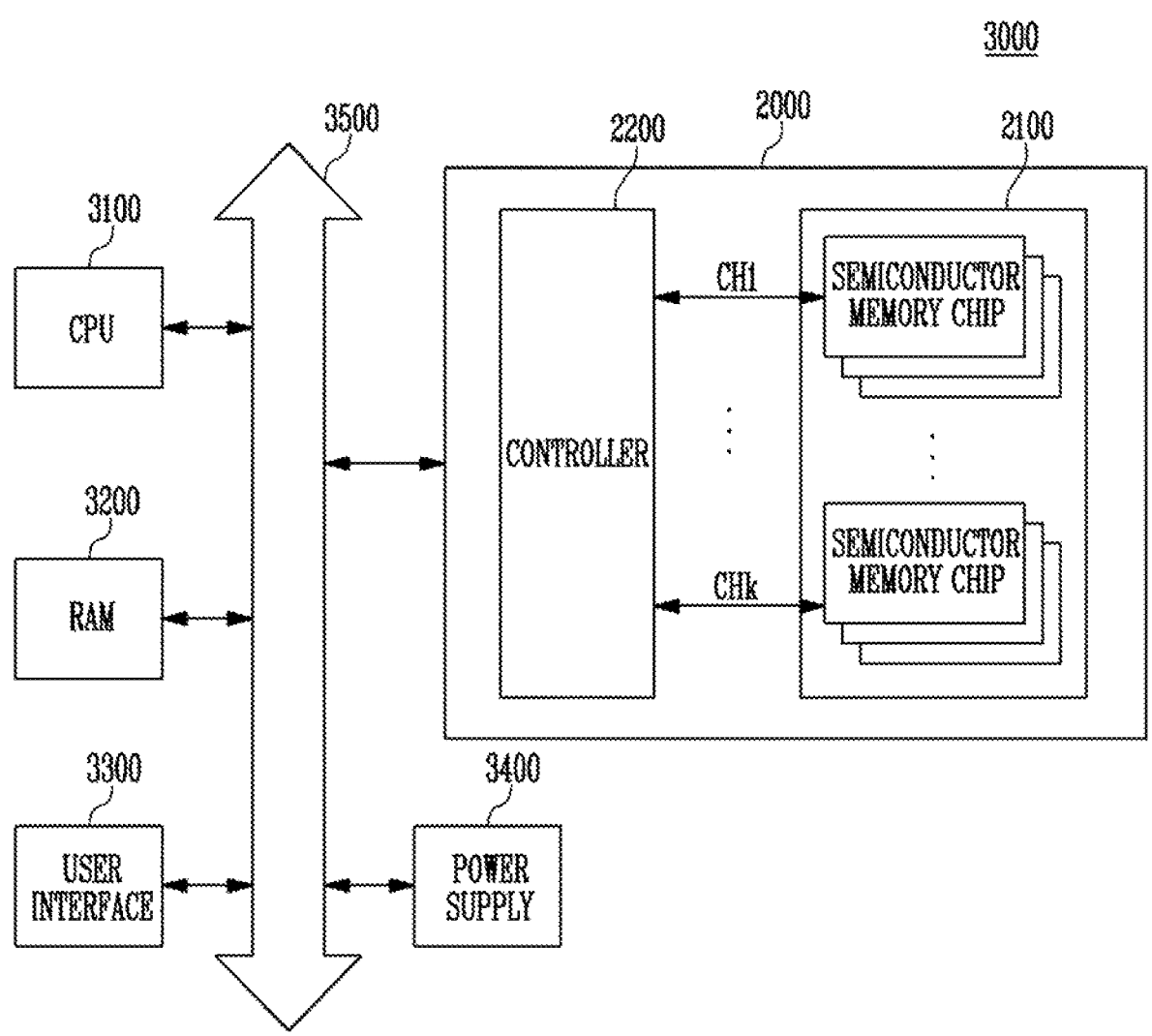
FIG. 11 is a block diagram illustrating a computing system including a memory system, according to yet another embodiment of the present disclosure.

FIG. 11 is a block diagram illustrating a computing system including a memory system 2000 of FIG. 10.

Referring to FIG. 11, a computing system 3000 includes a central processing unit (CPU) 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 11, the semiconductor memory device 2100 is illustrated as being coupled to the system bus 3500 through the controller 2200. However, in a variation of this embodiment, the semiconductor memory device 2100 may be directly coupled to the system bus 3500 in which case the functions of the controller 2200 may be performed by the CPU 3100 and the RAM 3200.

In FIG. 11, the memory system 2000 described with reference to FIG. 10 is illustrated as being used. However, the memory system 2000 may be replaced with the memory system described with the memory systems of FIGS. 1 and 9. In an embodiment, the computing system 3000 may include all of the memory systems 1000 and 2000 described with reference to FIGS. 1 and 10.

In accordance with embodiments of the present disclosure, there are provided a semiconductor memory device and a method of operating the semiconductor memory device, which have an improved processing speed for a suspend operation.

Although the exemplary embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them. Furthermore, the embodiments disclosed in the present specification and the drawings just aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
    a memory cell array;
    a peripheral circuit configured to perform a data operation corresponding to an externally provided command on the memory cell array; and
    a control circuit configured to control the peripheral circuit to perform the data operation by sequentially executing instructions corresponding to a plurality of instruction lines of an operation algorithm for the data operation and, when a suspend command is provided during the data operation, to perform a preset suspend operation to suspend the data operation in any one of a checker mode and an instant mode,
    wherein the operation includes at least one of a program operation, a read operation or an erase operation for the memory cell array,
    wherein, in the checker mode, the peripheral circuit stops the data operation and performs the preset suspend operation when a suspend checker is marked in a currently executed instruction line among the plurality of instruction lines of the operation algorithm for the data operation, and
    wherein the suspend checker is marked in the plurality of instruction lines in regular intervals.

2. The semiconductor memory device according to claim 1,
    wherein in the instant mode the peripheral circuit immediately stops the data operation and performs the preset suspend operation upon reception of the suspend command.

3. The semiconductor memory device according to claim 2,
    wherein the control circuit comprises:
    an operation counter configured to sequentially increase an instruction line address representing the plurality of instruction lines of the operation algorithm for the data operation;
    an operation algorithm execution circuit configured to execute the instructions corresponding to the plurality of instruction lines of the operation algorithm for the data operation according to the instruction line address provided from the operation counter; and
    a suspend decision circuit configured to initialize the operation counter immediately upon reception of the suspend command in the instant mode, and to initialize the operation counter when the suspend checker is marked in the currently executed one among the plurality of instruction lines of the operation algorithm for the data operation in the checker mode, and
    wherein the operation algorithm execution circuit executes the instructions of a suspend operation instruction line for the preset suspend operation among the plurality of instruction lines according to the initialization of the operation counter thereby controlling the peripheral circuit to perform the preset suspend operation.

4. The semiconductor memory device according to claim 3, wherein the suspend operation instruction line for the preset suspend operation is an initial instruction line of the operation algorithm.

5. The semiconductor memory device according to claim 1,
    wherein the data operation is the program operation, and
    wherein the suspend operation is an operation of storing data that is currently being programmed in the memory cell array.

6. The semiconductor memory device according to claim 1, wherein the suspend operation is an operation of storing in the memory cell array internal parameter values of the semiconductor memory device when the suspend command is provided.

7. A method of operating a semiconductor memory device including a plurality of memory cells, the method comprising:
    performing a data operation corresponding to an externally provided command on the memory cells by sequentially executing instructions corresponding to a plurality of instruction lines of an operation algorithm for the data operation; and performing a preset suspend operation to suspend the data operation in any one of a checker mode and an instant mode when a suspend command is provided during the data operation, wherein, in the checker mode, the preset suspend operation is performed by stopping the data operation when a suspend checker is marked in currently executed one among the plurality of instruction lines of the operation algorithm for the data operation, wherein, in the instant mode, the preset suspend operation is performed by immediately stopping the data operation upon reception of the suspend command, wherein the data operation includes at least one of a program operation, a read operation or an erase operation for a memory cell array, and wherein the suspend checker is marked in the plurality of instructions in regular intervals.

8. The method according to claim 7, wherein the performing of the data operation comprises:

sequentially increasing an instruction line address representing the plurality of instruction lines of the operation algorithm for the data operation; and executing the instructions corresponding to the plurality of instruction lines of the operation algorithm for the data operation according to the instruction line address.

9. The method according to claim 8, wherein the performing of the preset suspend operation comprises:

initializing the sequentially increasing of the instruction line address immediately upon reception of the suspend command in the instant mode, and when the suspend checker is marked in the currently executed one among the plurality of instruction lines of the operation algorithm for the data operation in the checker mode; and executing the instructions of a suspend operation instruction line for the preset suspend operation among the plurality of instruction lines according to the initialization thereby performing the preset suspend operation.

10. The method according to claim 7, wherein the suspend operation instruction line for the preset suspend operation is an initial instruction line of the operation algorithm.

11. The method according to claim 7, wherein the data operation is the program operation, and wherein the suspend operation is an operation of storing data that is currently being programmed in the memory cells.

12. The method according to claim 7, wherein the suspend operation is an operation of storing in the memory cells internal parameter values of the semiconductor memory device when the suspend command is provided.

13. A control circuit for a semiconductor memory device, comprising:

an execution circuit configured to sequentially execute instructions of an operation algorithm for a data operation corresponding to an externally provided command; and an execution control circuit configured to control the execution circuit to execute instructions for a suspend operation among the instructions of the operation algorithm for the data operation immediately upon reception of a suspend command in an instant mode, and to execute the instructions for the suspend operation when a suspend checker is marked in a currently executed one among the instructions of the operation algorithm for the data operation in a checker mode, wherein, in the checker mode, the execution circuit controls the semiconductor memory device to stop the data operation and perform the suspend operation when the suspend checker is marked in the currently executed instruction, wherein in the instant mode the execution circuit controls the semiconductor memory device to immediately stop the data operation and perform the suspend operation upon reception of the suspend command, wherein the data operation includes at least one of a program operation, a read operation or an erase operation for a memory cell array, and wherein the suspend checker is marked in the instructions in regular intervals.

* * * * *